(12) United States Patent
Hsu et al.

(10) Patent No.: US 10,181,558 B2
(45) Date of Patent: Jan. 15, 2019

(54) MAGNETORESISTIVE RANDOM ACCESS MEMORY STRUCTURE AND METHOD OF FORMING THE SAME

(71) Applicant: Taiwan Semiconductor Manufacturing Company, Ltd., Hsinchu (TW)

(72) Inventors: Chern-Yow Hsu, Chu-Bei (TW); Wei-Hang Huang, Kaohsiung (TW); Shih-Chang Liu, Alian Township (TW); Chia-Shiung Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/455,720

(22) Filed: Mar. 10, 2017

(65) Prior Publication Data

US 2017/0186946 A1    Jun. 29, 2017

Related U.S. Application Data

(62) Division of application No. 13/945,534, filed on Jul. 18, 2013, now Pat. No. 9,595,661.

(51) Int. Cl.
| | |
|---|---|
| *H01L 43/12* | (2006.01) |
| *H01L 27/22* | (2006.01) |
| *H01L 43/08* | (2006.01) |
| *H01L 43/02* | (2006.01) |
| *G11C 11/16* | (2006.01) |

(52) U.S. Cl.
CPC ............ *H01L 43/12* (2013.01); *G11C 11/161* (2013.01); *H01L 27/222* (2013.01); *H01L 27/228* (2013.01); *H01L 43/02* (2013.01); *H01L 43/08* (2013.01)

(58) Field of Classification Search
CPC ........ H01L 43/02; H01L 43/12; H01L 27/222
See application file for complete search history.

(56) References Cited

U.S. PATENT DOCUMENTS

| | | |
|---|---|---|
| 6,710,984 B1 | 2/2004 | Yuasa et al. |
| 7,989,224 B2 | 8/2011 | Gaidis |
| 8,339,841 B2 | 12/2012 | Iwayama |
| 2002/0167768 A1 | 11/2002 | Fontana, Jr. et al. |

(Continued)

FOREIGN PATENT DOCUMENTS

| | | |
|---|---|---|
| JP | 2001160640 A | 6/2001 |
| JP | 5117421 B2 | 1/2013 |
| KR | 20100119493 A | 11/2010 |

*Primary Examiner* — Marc Armand
*Assistant Examiner* — Quinton Brasfield
(74) *Attorney, Agent, or Firm* — Slater Matsil, LLP

(57) ABSTRACT

A magnetoresistive random access memory (MRAM) structure includes a bottom electrode structure. A magnetic tunnel junction (MTJ) element is over the bottom electrode structure. The MTJ element includes an anti-ferromagnetic material layer. A ferromagnetic pinned layer is over the anti-ferromagnetic material layer. A tunneling layer is over the ferromagnetic pinned layer. A ferromagnetic free layer is over the tunneling layer. The ferromagnetic free layer has a first portion and a demagnetized second portion. The MRAM also includes a top electrode structure over the first portion.

20 Claims, 3 Drawing Sheets

(56) References Cited

U.S. PATENT DOCUMENTS

| | | | |
|---|---|---|---|
| 2004/0043526 A1* | 3/2004 | Ying | H01L 43/12 438/38 |
| 2005/0277206 A1 | 12/2005 | Gaidis et al. | |
| 2007/0187785 A1* | 8/2007 | Hung | H01L 43/12 257/421 |
| 2010/0276768 A1 | 11/2010 | Gaidis | |
| 2011/0235217 A1* | 9/2011 | Chen | H01L 43/12 427/130 |
| 2012/0018824 A1 | 1/2012 | Lim et al. | |
| 2013/0032907 A1 | 2/2013 | Satoh et al. | |
| 2014/0210103 A1* | 7/2014 | Satoh | H01L 43/12 257/774 |

\* cited by examiner

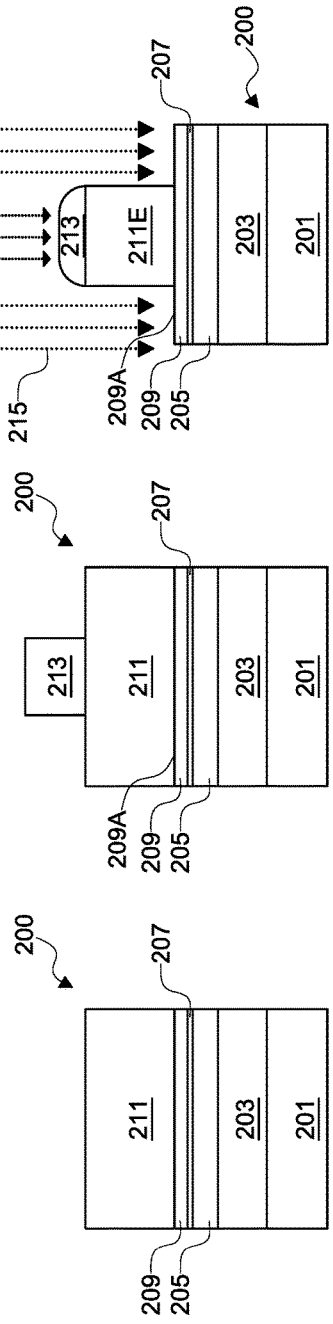

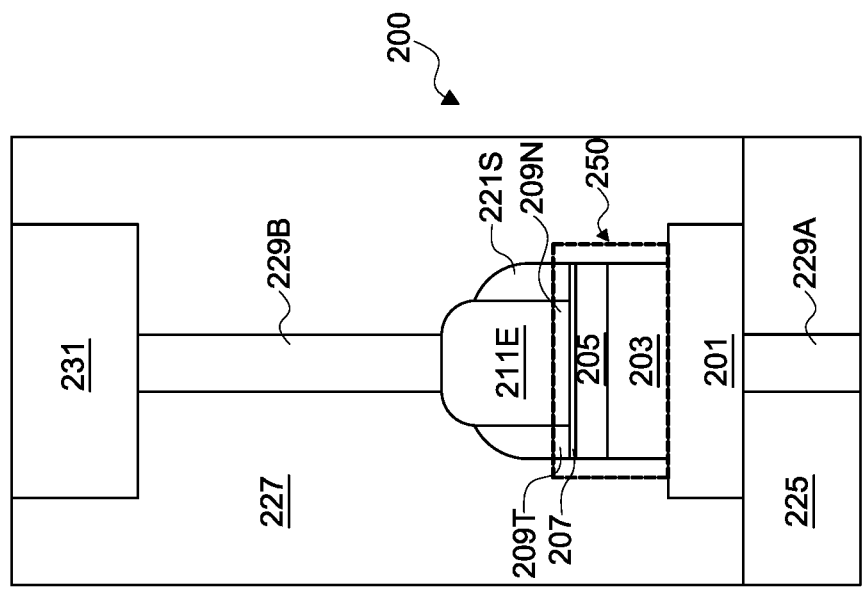

US 10,181,558 B2

MAGNETORESISTIVE RANDOM ACCESS MEMORY STRUCTURE AND METHOD OF FORMING THE SAME

PRIORITY CLAIM AND CROSS-REFERENCE

This application is a division of U.S. patent application Ser. No. 13/945,534 filed on Jul. 18, 2013, entitled "Magnetoresistive Random Access Memory Structure and Method of Forming the Same," which application is hereby incorporated herein by reference.

TECHNICAL FIELD

This disclosure relates generally to a semiconductor structure and, more particularly, to a magnetoresistive random access memory structure and method of forming a magnetoresistive random access memory structure.

BACKGROUND

In integrated circuit (IC) devices, magnetoresistive random access memory (MRAM) is an emerging technology for next generation non-volatile memory devices. MRAM is a memory structure including an array of MRAM cells. A bit of data in each cell is read using resistance, rather than electronic charge. Particularly, each MRAM cell includes a magnetic tunnel junction (MTJ) element, and the resistance of the MTJ element is adjustable to represent logic "0" or logic "1". The MTJ element includes one ferromagnetic pinned layer and one ferromagnetic free layer separated by a tunneling insulating layer. The resistance of the MTJ element is adjusted by changing a direction of the magnetic moment of the ferromagnetic free layer with respect to that of the ferromagnetic pinned layer. The low and high resistances are utilized to indicate a digital signal "1" or "0", thereby allowing for data storage.

From an application point of view, MRAM has many advantages. MRAM has a simple cell structure and CMOS logic comparable processes which result in a reduction of the manufacturing complexity and cost in comparison with other non-volatile memory structures. Despite the attractive properties noted above, a number of challenges exist in connection with developing MRAM. Various techniques directed at configurations and materials of these MRAMs have been implemented to try and further improve device performance.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2G are cross-sectional views of a MRAM structure at various stages of manufacture according to one or more embodiments of the method of FIG. 1.

DETAILED DESCRIPTION

Figure 1:
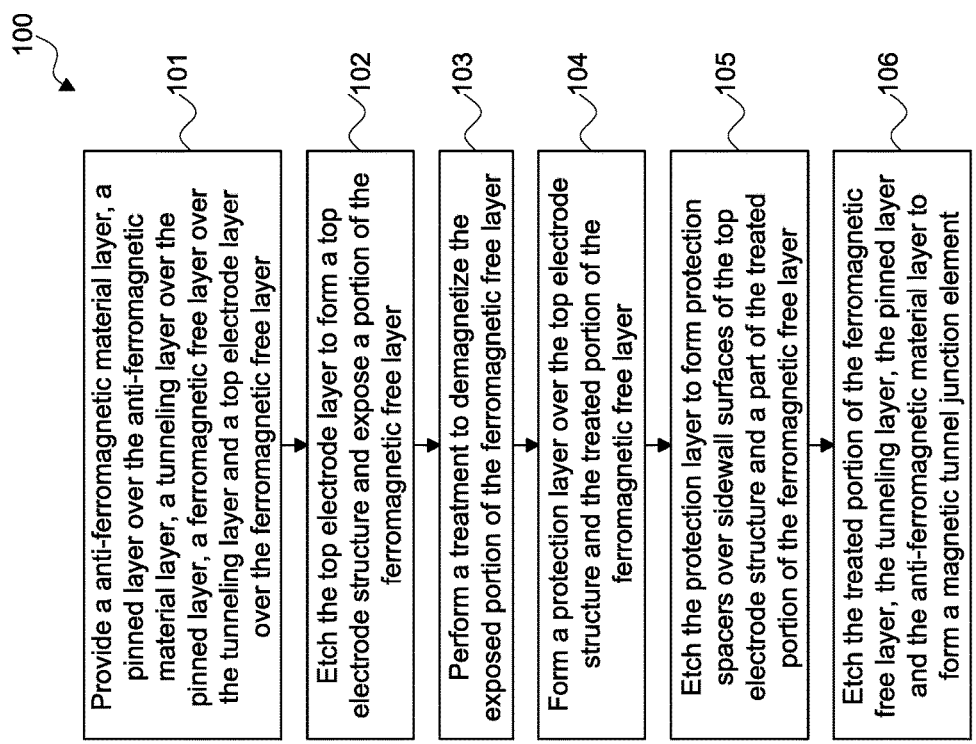
FIG. 1 is a flowchart of a method of forming a magnetoresistive random access memory (MRAM) structure according to at least one embodiment of this disclosure.

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

According to one or more embodiments of this disclosure, a magnetoresistive random access memory (MRAM) structure is formed. The MRAM structure includes a magnetic tunnel junction (MTJ) element. The MTJ element includes a tunnel layer formed between a ferromagnetic pinned layer and a ferromagnetic free layer. The tunnel layer is thin enough (typically a few nanometers) to permit electrons to tunnel from one ferromagnetic layer to the other. A resistance of the MTJ element is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the MTJ element is in a lower resistive state, corresponding to a digital signal "0". When the magnetic moment of the ferromagnetic free layer is anti-parallel to that of the ferromagnetic pinned layer, the resistance of the MTJ element is in a higher resistive state, corresponding to a digital signal "1". The MTJ element is coupled between top and bottom electrode structures and an electric current flowing through the MTJ element (tunneling through the tunnel layer) from one electrode to the other is detected to determine the resistance and the digital signal state of the MTJ element.

According to one or more embodiments of this disclosure, the MRAM structure is formed within a chip region of a substrate. A plurality of semiconductor chip regions is marked on the substrate by scribe lines between the chip regions. The substrate will go through a variety of cleaning, layering, patterning, etching and doping steps to form the MRAM structures. The term "substrate" herein generally refers to a bulk substrate on which various layers and device elements are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

FIG. 1 is a flowchart of a method 100 of forming a semiconductor structure having a MRAM structure according to at least one embodiment of this disclosure. FIGS. 2A to 2G are cross-sectional views of a MRAM structure 200 at various stages of manufacture according to various embodiments of the method 100 of FIG. 1. Additional processes may be performed before, during, or after the method 100 of FIG. 1. Various figures have been simplified for a better understanding of the inventive concepts of the present disclosure.

Referring now to FIG. 1, the flowchart of the method 100 begins with operation 101. In at least one embodiment, a pinned layer over an anti-ferromagnetic material layer, a tunneling layer over the pinned layer, a ferromagnetic free layer over the tunneling layer and a top electrode layer over the ferromagnetic free layer are provided. The anti-ferromagnetic material layer is formed over a bottom electrode structure. The bottom electrode structure is formed over a conductive plug embedded in a dielectric layer, which is over a substrate.

Referring to FIG. 2A, which is a cross-sectional view of a portion of a MRAM structure 200 after performing operation 101. The MRAM structure 200 includes a substrate (not shown).

A conductive plug (not shown) is formed embedded in a dielectric layer (not shown) over the substrate. In some embodiments, the conductive plug includes aluminum, aluminum alloy, copper, copper alloy, titanium, titanium nitride, tantalum, tantalum nitride, tungsten, metal silicide, silicon or combinations thereof. The dielectric layer comprises silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, or combinations thereof. In some embodiments, the formation process includes chemical vapor deposition (CVD), atomic layer deposition (ALD), high density plasma CVD (HDPCVD) or spin-on glass (SOG).

A bottom electrode structure 201 is formed over a top surface of the dielectric layer and electrically contacts the conductive plug. The bottom electrode structure 201 includes a conductive material. In some embodiments, the bottom electrode structure 201 comprises titanium (Ti), tantalum (Ta), platinum (Pt), ruthenium (Ru), tungsten (W), aluminum (Al), copper (Cu) or combinations thereof. Possible formation methods of the bottom electrode structure 201 include sputtering, PVD or ALD. In some embodiments, the bottom electrode structure 201 is electrically connected to an underlying electrical component, such as a transistor, through the conductive plug.

Still referring to FIG. 2A, an anti-ferromagnetic material (AFM) layer 203 is formed over the bottom electrode structure 201. In the anti-ferromagnetic material (AFM) layer 203, magnetic moments of atoms (or molecules) align in a regular pattern with magnetic moments of neighboring atoms (or molecules) in opposite directions. A net magnetic moment of the AFM layer 203 is zero. In certain embodiments, the AFM layer 203 includes platinum manganese (PtMn). In some embodiments, the AFM layer 203 includes iridium manganese (IrMn), rhodium manganese (RhMn), or iron manganese (FeMn). Possible formation methods of the AFM layer 203 include sputtering, PVD or ALD. The AFM layer 203 has a thickness in a range from about 100 Å to about 200 Å.

A ferromagnetic pinned layer 205 is formed over the AFM layer 203. The ferromagnetic pinned layer 205 forms a permanent magnet and exhibits strong interactions with magnets. A direction of a magnetic moment of the ferromagnetic pinned layer 205 is pinned by the adjacent AFM layer 203 and is not changed during operation of its associated magnetic tunnel junction (MTJ) element of the MRAM structure 200. In certain embodiments, the ferromagnetic pinned layer 205 includes cobalt-iron-boron (CoFeB). In some embodiments, the ferromagnetic pinned layer 205 includes CoFeTa, NiFe, Co, CoFe, CoPt, or the alloy of Ni, Co and Fe. Possible formation methods of the ferromagnetic pinned layer 205 include sputtering, PVD or ALD. In at least one embodiment, the ferromagnetic pinned layer 205 includes a multilayer structure.

A tunneling layer 207 is formed over the ferromagnetic pinned layer 205. The tunneling layer 207 is thin enough that electrons are able to tunnel through the tunneling layer when a biasing voltage is applied on the MRAM structure 200. In certain embodiments, the tunneling layer 207 includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). The tunneling layer 207 has a thickness in a range from about 5 Å to about 30 Å. Possible formation methods of the tunneling layer 207 include sputtering, PVD or ALD.

Still referring to FIG. 2A, the MRAM structure 200 includes a ferromagnetic free layer 209 formed over the tunneling layer 207. A direction of a magnetic moment of the ferromagnetic free layer 205 is not pinned because there is no anti-ferromagnetic material adjacent the ferromagnetic free layer 209. Therefore, the magnetic orientation of this layer is adjustable, thus the layer is referred to as a free layer. In at least one embodiment, the direction of the magnetic moment of the ferromagnetic free layer 209 is free to rotate parallel or anti-parallel to the pinned direction of the magnetic moment of the ferromagnetic pinned layer 205. The ferromagnetic free layer 209 may include a ferromagnetic material similar to the material in the ferromagnetic pinned layer 205. In certain embodiments, the ferromagnetic free layer 209 includes cobalt, nickel, iron or boron. Possible formation methods of the ferromagnetic free layer 209 include sputtering, PVD or ALD.

The MRAM structure 200 includes a top electrode layer 211 formed over the ferromagnetic free layer 209. The top electrode layer 211 includes a conductive material. In some embodiments, the top electrode layer 211 is similar to the bottom electrode structure 201 in terms of composition. In some embodiments, the top electrode layer 211 comprises titanium (Ti), tantalum (Ta), platinum (Pt), ruthenium (Ru), tungsten (W), aluminum (Al), copper (Cu) or combinations thereof. The top electrode layer 211 provides electrical connection from the MRAM structure 200 to other portions through interconnect structure for electrical routing.

Referring to FIG. 2B, a patterned mask layer 213 is formed over the top electrode layer 211. In certain embodiments, the patterned mask layer 213 includes a dielectric material such as oxide, nitride or oxy-nitride. The patterned mask layer 213 is formed by a suitable process, including deposition, lithography patterning, and etching processes. The patterned mask layer 213 is used as an etching mask to define a top electrode structure.

Referring back to FIG. 1, method 100 continues with operation 102. In operation 102, the top electrode layer is etched to form a top electrode structure and to expose a portion of the ferromagnetic free layer.

Referring to FIG. 2C, which is a cross-sectional view of a portion of the MRAM structure 200 after performing operation 102. An etching process 215 is performed to define a top electrode structure 211E and remove the top electrode layer 211 not covered by the patterned mask layer 213. The etching process 215 may stop at a top surface of the ferromagnetic free layer 209 and a portion of the ferromagnetic free layer 209 is exposed after the etching process 215. The top electrode structure 211E has sidewall surfaces. In some embodiments, a part of the patterned mask layer 213 is consumed during the etching process 215 and a remaining patterned mask layer 213 is left for the following processes.

Referring back to FIG. 1, method 100 continues with operation 103. In operation 103, a treatment is performed to demagnetize the exposed portion of the ferromagnetic free layer.

Referring to FIG. 2D, which is a cross-sectional view of a portion of the MRAM structure 200 after performing operation 103. A treatment 217 is performed on the exposed portion 209T of the ferromagnetic free layer. The treatment 217 demagnetizes the exposed portion 209T of the ferromagnetic free layer. A portion 209N of the ferromagnetic free layer under the top electrode structure 211E is not treated with the treatment 217. The portion 209N of the ferromagnetic free layer is configurable to change a direction of a first magnetic moment with respect to a direction of a second magnetic moment of the ferromagnetic pinned layer 205. The treated portion 209T of the ferromagnetic free layer is not able to change the direction of the first magnetic moment with respect to the direction of the second magnetic moment of the ferromagnetic pinned layer 205.

In certain embodiments, the treatment 217 is performed in a plasma environment. In some embodiments, the plasma environment includes a major gas such oxygen or nitrogen. An operation pressure of the plasma environment is in a range from about 1 mini-Torr (mT) to about 1000 mT. Out of this pressure range, maintaining a stable plasma operation is difficult or the plasma is not able to ignite, in some instances. A flow of the major gas of oxygen or nitrogen in the ambience is in a range from about 5 sccm to about 500 sccm. A carrier gas (or inert gas) such as Ar, He or Xe is added, in some embodiments. In at least one example, a ratio of a flow of the carrier gas to the flow of the major gas is in a range from about 80 to about 120. Out of this flow range, demagnetizing the exposed portion 209T of the ferromagnetic free layer is difficult, or the treatment 217 will laterally damage parts of the portion 209N of the ferromagnetic free layer under the top electrode structure 211E, in some instances.

In some embodiments, the treatment 217 is performed in a thermal treatment process. In some embodiments, the treated portion 209T of the ferromagnetic free layer includes cobalt, nickel, iron, boron, oxygen or nitrogen.

Referring back to FIG. 1, method 100 continues with operation 104. In operation 104, a protection layer is formed over the top electrode structure and the treated portion of the ferromagnetic free layer.

Referring to FIG. 2E, which is a cross-sectional view of a portion of the MRAM structure 200 after performing operation 104. A protection layer 221 is blanket deposited over the patterned mask layer 213, the sidewall surfaces of top electrode structure 211E, and the treated portion 209T of the ferromagnetic free layer. The protection layer 221 includes at least one dielectric material such as silicon oxide, silicon nitride, silicon oxy-nitride or low-k dielectric. Possible formation methods of the protection layer 221 include CVD, SOG or ALD.

Referring back to FIG. 1, method 100 continues with operations 105 and 106. In operation 105, the protection layer is etched to form protection spacers over sidewall surfaces of the top electrode structure and a part of the treated portion of the ferromagnetic free layer. In operation 106, the treated portion of the ferromagnetic free layer, the tunneling layer, the pinned layer and the anti-ferromagnetic material layer are etched to form a magnetic tunnel junction element. In some embodiments, the operations 105 and 106 are performed in a same assembly having different process chambers without exposing the magnetic tunnel junction element to an external environment, such as air, between the operations 105 and 106.

Referring to FIG. 2F, which is a cross-sectional view of a portion of the MRAM structure 200 after performing operations 105 and 106. An etching process (not shown) is performed to etch the protection layer 221 and remove most part of the protection layer 221 over the treated portion 209T of the ferromagnetic free layer. Protection spacers 221S are formed over the sidewall surfaces of the top electrode structure 211E and a part of the treated portion 209T of the ferromagnetic free layer. In some embodiments, the patterned mask layer 213 is consumed in this etching process and a top surface of the top electrode structure 211E is exposed.

Still referring to FIG. 2F, which is a cross-sectional view of a portion of the MRAM structure 200 after performing operation 106. An etching process 223 is performed to etch the treated portion 209T of the ferromagnetic free layer, the tunneling layer 207, the ferromagnetic pinned layer 205 and the AFM layer 203 to form a magnetic tunnel junction (MTJ) element 250. In some embodiments, the etching process 223 is performed in a plasma environment. Portions of layers 209, 207, 205 and 203 which are not covered by the protection spacers 221S and the top electrode structure 211E are removed. The protection spacers 221S are used as an etching mask to form the MTJ element 250A, sidewall surface of the protection spacers 221S is substantially aligned with a sidewall surface of the MTJ element 250. The MTJ element 250 includes the AFM layer 203, the ferromagnetic pinned layer 205, the tunneling layer 207, the portion 209N (also referred as a functional portion 209N) of the ferromagnetic free layer under the top electrode structure 211E and the treated portion 209T (also referred as a non-functional portion 209T) of the ferromagnetic free layer. The non-functional portion 209T of the ferromagnetic free layer extends beyond an edge of the top electrode structure 211E.

Advantageously, the functional portion 209N of the ferromagnetic free layer is surrounded by the non-functional portion 209T and is isolated from the plasma environment during formation of the MTJ element 250. The magnetic characteristics of the functional portion 209N are not degraded due to plasma attack in the etching process 223 for the MTJ element 250 formation, in some embodiments. The electrical characteristic stability for the MRAM structure 200 is enhanced due to maintaining the magnetic characteristics of the functional portion 209N.

FIG. 2G is a cross-sectional view of the MRAM structure 200 optionally formed after performing operation 106. The MRAM structure 200 further includes a dielectric layer 225 and a conductive plug 229A under the bottom electrode structure 201. An inter-metal dielectric (IMD) layer 227 is formed over the MRAM structure 200 shown in FIG. 2F. In some embodiments, the IMD layer 227 surrounds the MRAM structure 200. A chemical mechanical polishing (CMP) process is further applied to the MRAM structure 200 to planarize the IMD layer 227. The IMD layer 227 includes multiple dielectric layers, in some embodiments. In some embodiments, the IMD layer 227 comprises silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, or combinations thereof.

In certain embodiments, a dual damascene process is performed in the IMD layer 227 to form a conductive wire 231 and a conductive plug 229B which electrically contacts the top electrode structure 211E. A conductive material of the conductive wire 231 and the conductive plug 229B includes copper, copper alloys, aluminum or tungsten.

One aspect of the disclosure describes magnetoresistive random access memory (MRAM) structure. The MRAM structure includes a bottom electrode structure. A magnetic tunnel junction (MTJ) element is over the bottom electrode structure. The MTJ element includes an anti-ferromagnetic material layer. A ferromagnetic pinned layer is disposed over the anti-ferromagnetic material layer. A tunneling layer is disposed over the ferromagnetic pinned layer. A ferromagnetic free layer is disposed over the tunneling layer. The ferromagnetic free layer has a first portion and a demagnetized second portion. The MRAM also includes a top electrode structure disposed over the first portion.

A further aspect of the disclosure describes a MRAM structure. The MRAM structure includes a bottom electrode structure. A magnetic tunnel junction (MTJ) element is over the bottom electrode structure. The MTJ element includes an anti-ferromagnetic material layer over the bottom electrode structure. A ferromagnetic pinned layer is disposed over the anti-ferromagnetic material layer. A tunneling layer is disposed over the ferromagnetic pinned layer. A ferromagnetic free layer is disposed over the tunneling layer. The ferromagnetic free layer has a first portion and a treated second portion. The MRAM also includes a top electrode structure disposed over the first portion of the ferromagnetic free layer. The top electrode structure has sidewall surfaces. Protection spacers are disposed over the sidewall surfaces of top electrode structure and over the treated second portion of the ferromagnetic free layer. The top electrode layer is etched to form a top electrode structure and expose a portion of the ferromagnetic free layer.

Another aspect of the disclosure describes a method of forming a MRAM structure. The semiconductor structure also includes a substrate. The method includes providing an anti-ferromagnetic material layer, a pinned layer over the anti-ferromagnetic material layer, a tunneling layer over the pinned layer, a ferromagnetic free layer over the tunneling layer and a top electrode layer over the ferromagnetic free layer. A treatment is performed on the exposed portion of the ferromagnetic free layer. A protection layer is formed over the top electrode structure and the treated portion of the ferromagnetic free layer. The protection layer is etched to form protection spacers over sidewall surfaces of the top electrode structure and a part of the treated portion of the ferromagnetic free layer. The treated portion of the ferromagnetic free layer, the tunneling layer, the pinned layer and the anti-ferromagnetic material layer are etched to form a magnetic tunnel junction element.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a magnetoresistive random access memory (MRAM) structure, the method comprising:
   providing an anti-ferromagnetic material layer, a pinned layer over the anti-ferromagnetic material layer, a tunneling layer over the pinned layer, a ferromagnetic free layer over the tunneling layer and a top electrode layer over the ferromagnetic free layer;
   etching the top electrode layer to form a top electrode structure and expose a portion of the ferromagnetic free layer;
   performing a treatment on the exposed portion of the ferromagnetic free layer;
   forming a protection layer over the top electrode structure and the treated portion of the ferromagnetic free layer;
   etching the protection layer to remove the protection layer from a top surface of the top electrode structure and form protection spacers over sidewall surfaces of the top electrode structure and a part of the treated portion of the ferromagnetic free layer; and
   after etching the protection layer to remove the protection layer from a top surface of the top electrode structure and form the protection spacers, etching the treated portion of the ferromagnetic free layer, the tunneling layer, the pinned layer and the anti-ferromagnetic material layer using the protection spacers as an etch mask to form a magnetic tunnel junction element.

2. The method of claim 1, further comprising forming a patterned mask layer over the top electrode layer before etching the top electrode layer to form the top electrode structure.

3. The method of claim 1, wherein the step of performing the treatment comprises treating in an environment of at least one of oxygen or nitrogen.

4. The method of claim 3, wherein the at least one of oxygen or nitrogen is in a range from about 5 sccm to about 500 sccm in the environment.

5. The method of claim 1, wherein the treatment comprises demagnetizing the exposed portion of the ferromagnetic free layer.

6. The method of claim 1, wherein the step of performing the treatment comprises treating the MRAM structure in a plasma environment.

7. The method of claim 1, wherein the treated portion of the ferromagnetic free layer is not able to change a direction of a magnetic moment with respect to a direction of a magnetic moment of the pinned layer.

8. The method of claim 1, wherein the protection spacers comprise a rounded surface extending away from the top electrode structure to a point aligned with a sidewall of the tunneling layer after etching the treated portion of the ferromagnetic free layer, the tunneling layer, the pinned layer and the anti-ferromagnetic material layer using the protection spacers as the etch mask to form the magnetic tunnel junction element.

9. A method of manufacturing a semiconductor device, the method comprising:
   depositing an electrode material in physical contact with a first portion of a ferromagnetic free layer, the ferromagnetic free layer being over a tunneling layer, a ferromagnetic pinned layer, and an anti-ferromagnetic layer;
   patterning the electrode material to form an electrode and expose the first portion of the ferromagnetic free layer;
   demagnetizing the first portion of the ferromagnetic free layer;
   forming a protection layer over the first portion of the ferromagnetic free layer;
   patterning the protection layer into spacers, wherein the patterning the protection layer exposes a top surface of the electrode, wherein the spacers comprise a rounded surface extending away from the electrode to a point aligned with a sidewall of the ferromagnetic free layer; and
   after patterning the protection layer into spacers, patterning the ferromagnetic free layer, the tunneling layer, the ferromagnetic pinned layer, and the anti-ferromagnetic layer using the spacers as an etch mask.

10. The method of claim 9, wherein the demagnetizing the first portion is performed in a plasma environment of a first precursor.

11. The method of claim 10, wherein the first precursor is oxygen.

12. The method of claim 10, wherein the first precursor is nitrogen.

13. The method of claim 10, wherein a flow rate of the first precursor is between about 5 sccm and about 500 sccm.

14. The method of claim 13, wherein a ratio of a flow rate of a carrier gas to a flow rate of the first precursor is between about 80 to about 120.

15. A method of manufacturing a semiconductor device, the method comprising:
    patterning an electrode material to expose a first surface of a ferromagnetic free layer;
    plasma-treating the first surface of the ferromagnetic free layer to demagnetize the first surface;
    depositing a protection spacer layer over a top surface of the electrode material;
    patterning the protection spacer layer to form a protective spacer adjacent to the electrode material and over the demagnetized first surface, wherein the electrode material extends away from the first surface further than the protective spacer; and
    after patterning the protection spacer layer, patterning the ferromagnetic free layer, an underlying tunneling layer, an underlying ferromagnetic pinned layer, and an underlying anti-ferromagnetic layer using the protection spacer as a mask.

16. The method of claim 15, wherein the plasma-treating the first surface further comprises exposing the first surface to an oxygen-based plasma.

17. The method of claim 15, wherein the plasma-treating the first surface further comprises exposing the first surface to a nitrogen-based plasma.

18. The method of claim 15, wherein the plasma-treating is performed in a pressure of between about 1 mT and about 1000 mT.

19. The method of claim 15, wherein the plasma-treating the first surface further comprises adding a carrier gas to a plasma precursor prior to the plasma-treating the first surface.

20. The method of claim 19, wherein a ratio of a flow of the carrier gas to a flow of the plasma precursor is in a range from about 80 to about 120.

* * * * *